United States Patent [19]
Nakamura et al.

[11] Patent Number: 5,880,405
[45] Date of Patent: *Mar. 9, 1999

[54] TERMINAL STRUCTURE FOR ELECTRONIC PART WITH STEPPED OFFSET PORTIONS

[75] Inventors: Hidehiro Nakamura; Yasunari Takano; Tetsuya Furusawa, all of Miyagi-ken, Japan

[73] Assignee: Alps Electric Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 762,116

[22] Filed: Dec. 10, 1996

[30] Foreign Application Priority Data

Dec. 28, 1995 [JP] Japan .................................. 7-343279

[51] Int. Cl.$^6$ ...................................................... H02G 3/08
[52] U.S. Cl. ........................ 174/52.1; 257/696; 361/773
[58] Field of Search ................................ 174/52.4, 52.1, 174/260; 361/772, 773, 774, 775, 743, 760, 807; 257/692, 694, 695, 696

[56] References Cited

U.S. PATENT DOCUMENTS

| | | | |
|---|---|---|---|
| 5,291,375 | 3/1994 | Mukai | 361/760 |
| 5,367,124 | 11/1994 | Hoffman et al. | 174/52.4 |
| 5,406,119 | 4/1995 | Numada | 257/692 |
| 5,456,610 | 10/1995 | Banakis et al. | 439/157 |

*Primary Examiner*—Kristine Kincaid
*Assistant Examiner*—Hung V. Ngo
*Attorney, Agent, or Firm*—Brinks Hofer Gilson & Lione

[57] ABSTRACT

A terminal structure for a surface mount electronic part including a terminal holding member formed from a synthetic resin, and external terminal extending from the terminal holding member for soldering to soldering lands of a printed wiring board. Each of the external terminals is held on the terminal holding member such that a straight portion projects laterally from the terminal holding member and is restricted direction (i.e., in width and thickness directions). The outermost tip portion of each external terminal includes an offset portion which is stepped downwards relative to the straight portion of the external terminal includes an offset portion which is stepped downwards relative to the straight portion of the external terminal and which is formed by half punching. The offset portion is provided for soldering to a soldering land of the printed wiring board. A region of the lower surface of the offset portion of each external terminal, which is continuous with a front end surface of the offset portion, is beveled to form an inclined surface such that the thickness of the offset portion decreases toward the front end surface.

5 Claims, 2 Drawing Sheets

TERMINAL STRUCTURE FOR ELECTRONIC PART WITH STEPPED OFFSET PORTIONS

BACKGROUND OF THE INVENTION

1. Field of the Invention

The present invention relates it a terminal structure for a surface mount electronic part provided with external terminals to be soldered to lands formed on a printed wiring board;projecting laterally,such as a connector for a PC card.

2. Description of the Related Art

The external terminals of most surface mount electronic parts,to be soldered to soldering lands formed on a printed wiring board,such as connectors for PC cards,have narrow width and are arranged at small pitches. Therefore,the terminals embedded in a synthetic resin so as to project laterally must be arrange in a high positional accuracy.

Referring to FIG. 3 typically showing a conventional terminal structure for an electronic part, base portions of external terminals 2 of an electronic part 1 are fixedly inserted in a housing 3 by press-fitting or embedded in the housing 3 by insert molding. A portion of each external terminal 2 projecting laterally from the housing 3 is bent to form a foot portion so that the foot portion is placed in a predetermined portion on a predetermined soldering land 5 of a printed wiring board 4 when mounting the electronic part 1 on the printed wiring board 4. The foot portion of the terminal 2 is bonded to the soldering land 5 by a solder fillet 6. When mounting the electronic part 1 on the printed wiring board 4, the foot portion of each terminal 2 is placed on the soldering land 5 coated with a soldering cream, and then the soldering cream is melted in a reflow furnace to bond the terminals 2 electrically and mechanically to the corresponding soldering lands 5 with the solder fillets 6.

Another conventional terminal structure shown in FIG. 4 has terminals 2 projecting from a housing, and terminal holders 7 put on the housing to hold and position the terminals 2. The end portions of the terminals 2 are bent substantially at right angles by the bottoms of the terminal holders 7 so that the end position of the terminal 2 to be soldered to soldering lands 5 formed on a printed wiring board 4 extend laterally from the terminal holders 7 and are positioned accurately.

However,it is not easy to form the terminals 2 of the conventional terminal structure shown in FIG. 3 in a high accuracy by a bending process,and the foot portions of the terminals 2 are liable to be dislocated in the direction of the thickness or the width thereof. Consequently, the foot portions of the terminals 2 are arranged in a low positional accuracy and the low positional accuracy of the foot portions of the terminals 2 is liable to cause faulty soldering when mounting the electronic part 1 on the printed wiring board 4. Since each terminal 2 must be projected from the housing 3 by a length long enough to prevent hindrance to forming the terminal 2. Therefore, the terminals 2 projecting in a free state from the housing 3 are liable to be distorted during transportation. Furthermore, the molten solder is sucked upward to and upper portion (high-temperature portion) of the terminal 2 by wicking and an insufficient quantity of solder is available for soldering.

The end portions of the terminals 2 of the conventional terminal structure shown in FIG. 4 are less possible to be dislocated in the direction of the width, the terminals 2 have strength high enough to resist distortion, and the terminals 2 avoid wicking. However, since the terminal holders 7 overlie the soldering lands 5, the terminal holders 7 hinder the visual inspection of the soldered terminals 2. Therefore, it is difficult to handle the electronic part and the reliability of soldering of the terminals 2 to the printed wiring board 4 is deteriorated. Since the end portions of the terminals 2 projection laterally from the terminal holders 7 are liable to slope in different inclinations, the end portions of the terminals 2 are liable to be dislocated in the direction of the thickness of the terminals 2 which often causes faulty soldering.

SUMMARY OF THE INVENTION

It is an object of the present invention to provide a terminal structure having external terminals which rarely cause faulty soldering, have strength high enough to resist distortion and do not hinder the visual inspection of soldered terminals.

According to one aspect of the present invention, a terminal structure for a surface mount electronic part comprises external terminals to be soldered to soldering lands of a printed wiring board, laterally projecting from synthetic resin member holding the external terminals, wherein the outermost portion of each external terminal is stepped down by half punching to form an offset portion.

Preferably, a region of the lower surface of the offset portion, continuous with the front end surface of the offset portion is beveled to form an inclined surface.

When the outermost portions of the external terminals are stepped down by half punching to form the offset portions, and the offset portions are soldered to soldering lands, the external terminals project laterally from so that the terminals are not firmly holding the terminals so that the terminals are not dislocated in the directions of thickness and width thereof, and the terminals need not be bent. Consequently, the outermost portions of the terminals are difficult to move in the directions of thickness and width thereof, the positional accuracy of the outermost portions of the terminals is improved, the strength of the terminals to resist distortion is enhanced and wicking can be avoided. Since the synthetic resin member does not overlap the soldering lands,the visual inspection of soldered terminals is not hindered by the synthetic resin member.

Furthermore, if a region of the lower surface of the offset portions beveled to form an inclined surface of the terminal, the area of the unplated front end surface which is difficult to wet with solder is reduced, and the area of the plated lower surface of the offset portion is increased, so that the offset portion can easily be soldered.

BRIEF DESCRIPTION OF THE DRAWINGS

The above and other objects, features and advantages of the invention will become more apparent from the following description taken in connection with the accompanying drawings, in which.

DESCRIPTION OF THE PREFERRED EMBODIMENT

Figure 1:
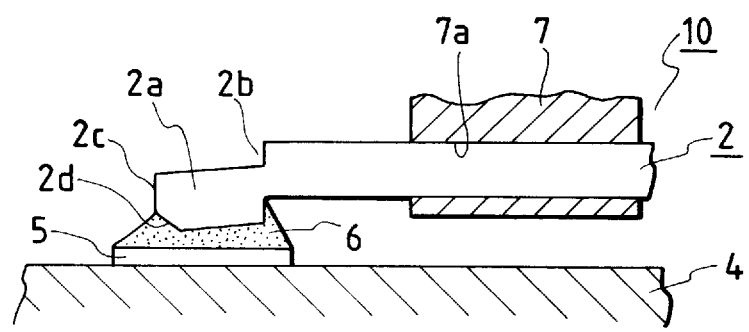
FIG. 1 is a sectional side view of a terminal structure in a preferred embodiment according to the present invention.
Figure 2:
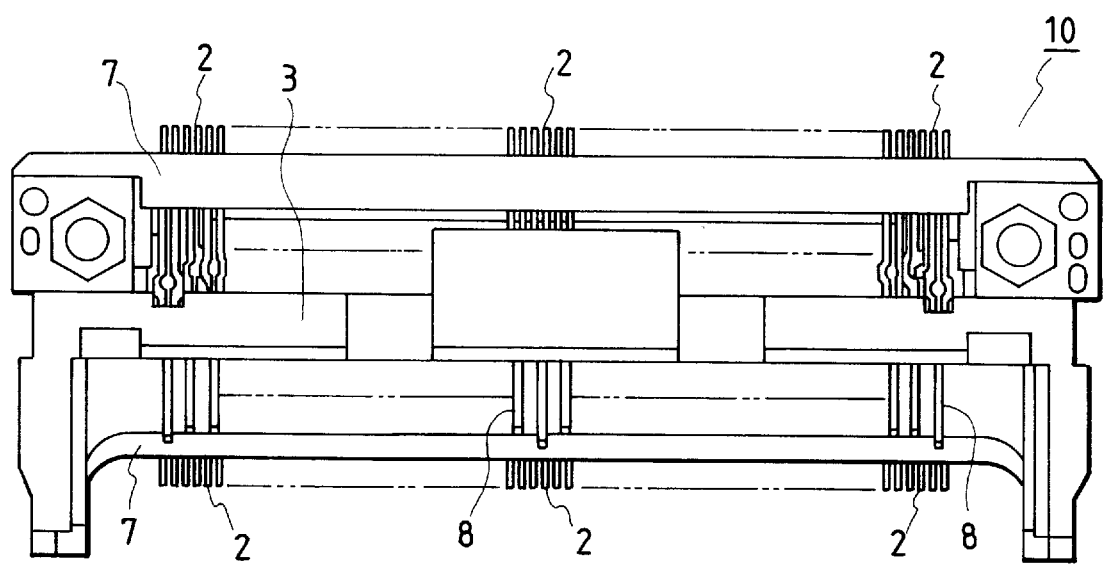
FIG. 2 is a plan view of a pin header unit including the terminal structure shown in FIG. 1 included in a connector for a PC card.
Figure 3:
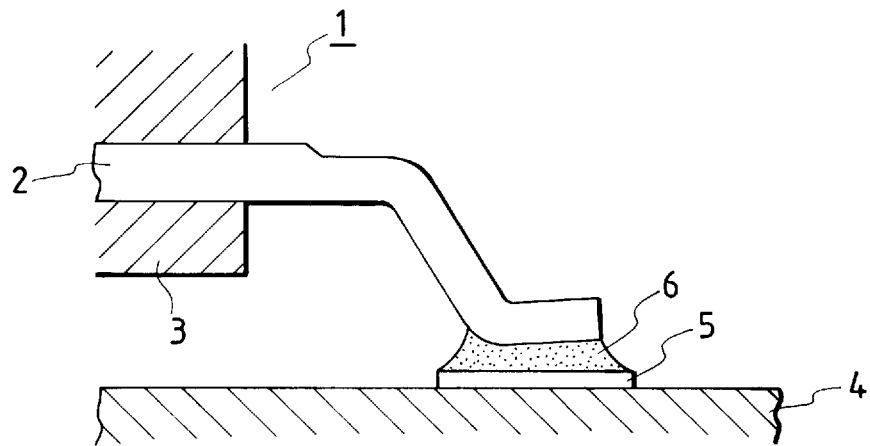
FIG. 3 is a sectional side view of a conventional terminal structure.
Figure 4:
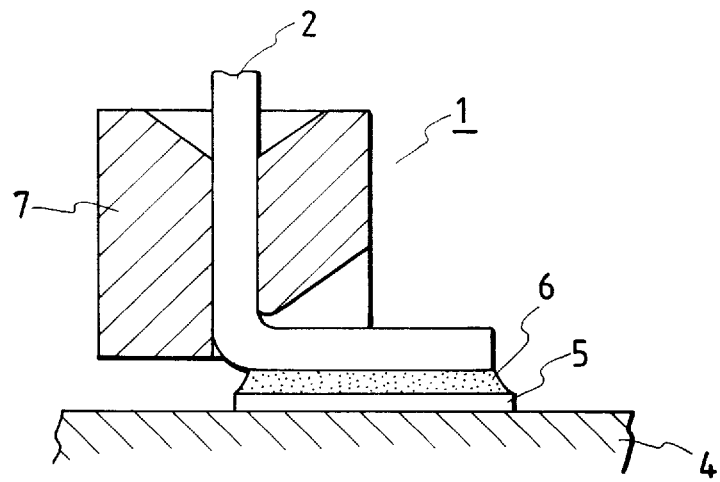
FIG. 4 is a sectional side view of another conventional terminal structure.

A preferred embodiment of the present invention will be described with reference to FIGS. 1 and 2, in which parts like or corresponding to those shown in FIGS. 3 and 4 are designated by the same reference numerals.

Referring to FIG. 2 showing a pin header unit 10 included in a connector for a PC card, 136 pin contacts 8 of brass are fixed to a housing 3 by press fitting. Back portions of the 136 pin contacts 8 projecting from the back surface of the housing 3 are held by a terminal holder 7 and serves as 136 external terminals 2. Sixty-eight external terminals 2 are arranged in the front portion of the pin header unit 10 and sixty-eight external terminals 2 are arranged in the back portion of the pin header unit 10. The terminals 2 are inserted through holes 7a (FIG. 1) formed in the terminal holder 7, and then an external force is applied to the terminal holder 7 for skating after attaching the terminal holder 7 to the housing 3 so that the terminals 2 are compressed and held firmly on the terminal holder 7. Outer portions of the terminals 2 project laterally from the terminal holder 7 (forward and backward from the pin header unit 10) by 1.4 mm, and the outermost portions of the outer portions of the terminals 2 are soldered to soldering lands 5 formed on a printed wiring board 4 as shown in FIG. 1. The terminals 2 are 0.3 mm in width and 0.3 mm in thickness, and are arranged at pitches of 0.635 mm.

As shown in FIG. 1, the outermost portion of the outer portion of each terminal 2 laterally projecting from the terminal holder 7 is stepped down to form an offset portion 2a of the terminal 2 is stepped down relative to the other portion of the terminal 2. A region of the lower surface of the offset portion 2a is formed by stepping down the outermost portion is a step 2b by half punching after fitting the terminal 2 in the hole 7a of the terminal holder 7, and after or before fixing the terminal 2 to the terminal holder 7 by staking. The offset portion 2a of the terminal 2 is stepped down relative to the other portion of the terminal 2. A region of the lower surface of the offset portion 2a continuous with a front end surface 2c is beveled to form an inclined surface 2d sloping upward as viewed in FIG. 1. The inclined surface 2d is a portion of a solder-plated surface of the terminal 2, and the front end surface 2c is an unplated surface formed by cutting the terminal 2 after the solder-plating process.

Since the terminal structure has the external terminals 2 fastened to the terminal holder 7 by staking, the terminals 2 are held securely with respect to the directions of thickness and width thereof. Since the terminals 2 have the offset portions 2a formed by stepping down the outermost portions of the outer portions of the terminals 2 laterally projecting from the terminal holder 7 by half punching, and the offset portions of the terminals 2 laterally projecting from the terminal holder 7 need not be bent and hence the portions 2a are placed on and bonded to the soldering lands 5 with solder fillets 6, respectively, the outer portions of the terminals 2 laterally projecting from the terminal holder 7 need not be bent and hence the outer portions of the terminals 2 need not be long. Consequently, there is not strong possibility that the outermost portions of the terminals 2 forming the offset portions 2a are dislocated in the directions of thickness and width thereof, the high positional accuracy of the offset portions 2a can be secured so that the offset portions 2a can correctly be put on the soldering lands 5, respectively, the terminals 2 may not accidentally be distorted during transportation because the terminals have an enhanced strength, and faulty soldering due to the shortage of effective solder will not occur because the wicking of solder in a reflow furnace is avoided. Since the terminal holder 7 does not overlap the offset portions 2a soldered to the soldering lands 5, the visual inspection of the result of soldering can easily be achieved and hence the facility and the reliability of the visual inspection are not deteriorated.

Since a portion of the plated lower surface of the offset portion 2a of each terminal 2 is deformed to form the inclined surface 2d continuous with the unplated front end surface 2c, the area of the unplated front end surface 2c to which the solder fillet 6 cannot easily stick is reduced, and the area of the plated lower surface of the offset portion 2a is increased, so that the solder fillet 6 is able to stick easily to the surface of the offset portion 2a.

The offset portions 2a of the terminals 2 included in the terminal structure of the present invention can easily be held in a high positional accuracy, are capable of avoiding wicking and are able to be bonded to the soldering lands 5 with sufficient solder fillets 6. Therefore, the terminals 2 of the terminal structure of the present invention is far less liable to cause faulty soldering than those of the conventional terminal structure. Although the invention has been described as applied to the terminal structure including the terminals 2 as the extensions of the pin contacts 8 of a connector for a PC card, naturally, the present invention is applicable to terminal structures of other surface mount electronic parts.

It will be understood that the invention may be embodied in other specific forms without departing from the scope and spirit thereof. The embodiment specifically described herein, therefore, is to be considered in all respects as illustrative and not restrictive, and the invention is not to be limited to the details given herein.

What is claimed is:

1. A terminal structure for a surface mount electronic part for mounting on a printed circuit board having soldering lands, said terminal structure comprising.

a terminal holding member formed from a synthetic resin; and external terminals for soldering to said soldering lands of said printed wiring board, each of the external terminals being held on the terminal holding member such that a straight portion of a first thickness partially contained withing the terminal holding projects in a lateral direction along a first plane and is prevented from moving in direction perpendicular to the lateral direction.

wherein an outermost tip portion of each external terminal includes an offset portion having a thickness the same as the first thickness and which is stepped down relative to and directly connected to an end of the straight portion of said each external terminal, said offset portion being formed so as to extend a second plane that is approximately parallel to said first plane.

2. The terminal structure for a surface mount electronic part according to claim 1, wherein a lower surface of the offset portion is a elongated flat surface extending generally parallel and offset vertically from the straight portion in an approximately half of the first thickness.

3. The terminal structure for a surface mount electronic part according to claim 1, wherein a distal region of a lower surface of the offset portion of each external terminal, which is continuous with a front end surface of the offset portion is beveled to form an inclined surface so that the thickness of the offset portion continuously decreases in the distal region toward the front end surface.

4. The terminal structure for a surface mount electronic part according to claim 3, wherein said offset portion lower surface is positionable to generally extend parallel to a soldering land and coextensive to a solder fillet between said lower surface and said soldering land.

5. The terminal structure for a surface mount electronic part according to claim 1, wherein said offset portion is formed by a half punched distal section extending generally laterally from said straight portion.

* * * * *

UNITED STATES PATENT AND TRADEMARK OFFICE
CERTIFICATE OF CORRECTION

PATENT NO. : 5,880,405
DATED : March 9, 1999
INVENTOR(S) : Hidehiro Nakamura et al.

It is certified that error appears in the above-identified patent and that said Letters Patent is hereby corrected as shown below:

<u>In the Claims</u>

In claim 1, line 10, replace "withing" with --within--.

In claim 1, line 19, after "extend" insert --along--.

In claim 2, line 3, replace "a" with --an--.

In claim 2, line 4, after "an" insert --amount--.

Signed and Sealed this

Seventh Day of September, 1999

Attest:

Q. TODD DICKINSON

Attesting Officer

Acting Commissioner of Patents and Trademarks